United States Patent
Rybicki et al.

(10) Patent No.: US 7,555,059 B2
(45) Date of Patent: *Jun. 30, 2009

(54) LOW POWER DISTRIBUTED TRANSMITTER

(75) Inventors: Mathew A. Rybicki, Austin, TX (US); Michael Cave, Pflugerville, TX (US); Michael May, Austin, TX (US); Timothy W Markison, Austin, TX (US)

(73) Assignee: Vixs Systems Inc, Toronto, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/591,405

(22) Filed: Nov. 1, 2006

(65) Prior Publication Data

US 2009/0022240 A1    Jan. 22, 2009

Related U.S. Application Data

(63) Continuation of application No. 10/026,130, filed on Dec. 18, 2001, now Pat. No. 7,184,490.

(51) Int. Cl.
*H04L 25/03* (2006.01)
*H03F 1/26* (2006.01)
*H04B 1/04* (2006.01)

(52) U.S. Cl. .................. 375/297; 375/295; 330/149; 455/114.3

(58) Field of Classification Search ............... 375/146, 375/219, 222, 260, 267, 295, 297; 370/208, 370/210; 330/149, 124 R; 455/13.4, 101, 455/103, 114.2, 114.3
See application file for complete search history.

(56) References Cited

U.S. PATENT DOCUMENTS

| | | | | |
|---|---|---|---|---|
| 5,646,631 | A * | 7/1997 | Arntz | 342/373 |
| 6,313,703 | B1 * | 11/2001 | Wright et al. | 330/149 |
| 6,639,463 | B1 * | 10/2003 | Ghanadan et al. | 330/124 R |
| 6,799,020 | B1 * | 9/2004 | Heidmann et al. | 455/103 |
| 2002/0176510 | A1 * | 11/2002 | Laroia | 375/267 |

* cited by examiner

*Primary Examiner*—Young T. Tse

(57) ABSTRACT

A low power distributed transmitter includes a signal generator, signal partitioning module, signal processing module, a plurality of amplifiers, and a transmitting module. The signal generator is operably coupled to generate a signal to represent base-band data in accordance with a particular transmission protocol. The signal partitioning module is operably coupled to partition the signal into a plurality of signal partitions based on a peak-to-average ratio of the signal. The signal processing module processes the plurality of signal partitions to in accordance with the particular transmission protocol to produce processed signals. Each of the amplifiers amplifies a corresponding one of the processed signal partitions to produce amplified signal partitioned. The transmitting module transmits, via an antenna or a plurality of antennas, the amplified signal partitions as a composite amplified signal.

9 Claims, 10 Drawing Sheets

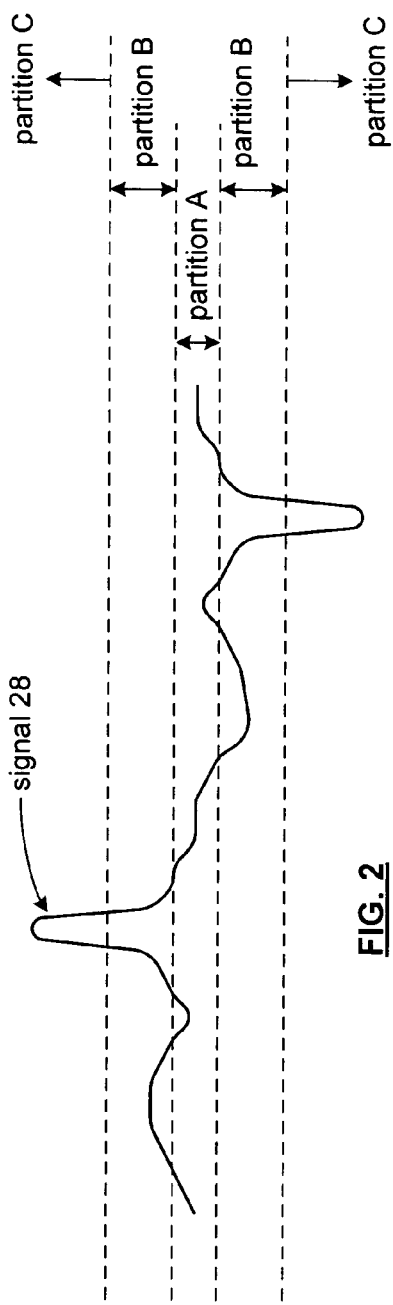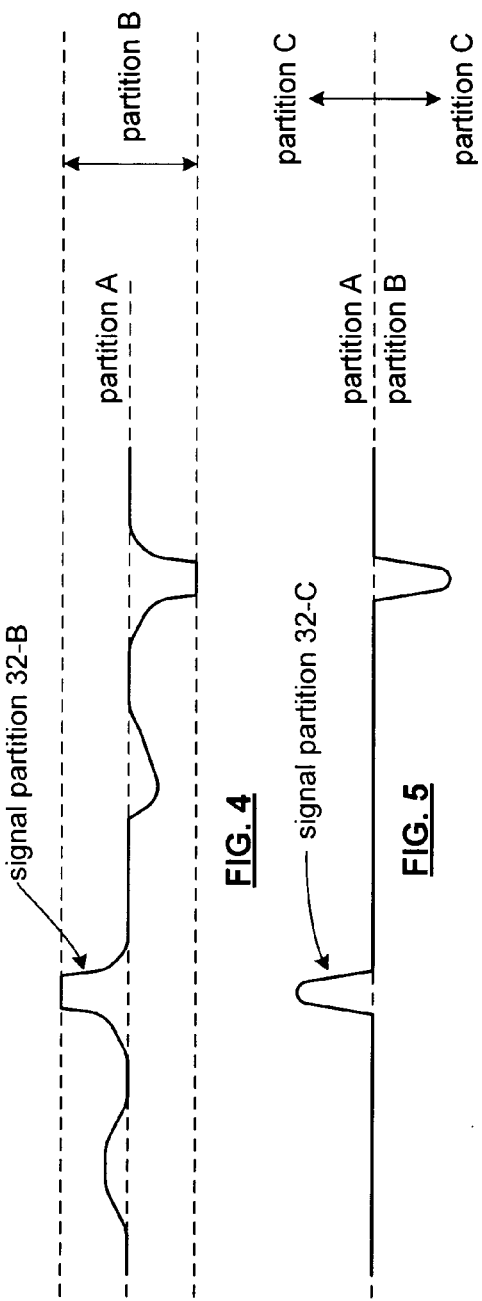

transmitting module 24 transmitting module 24

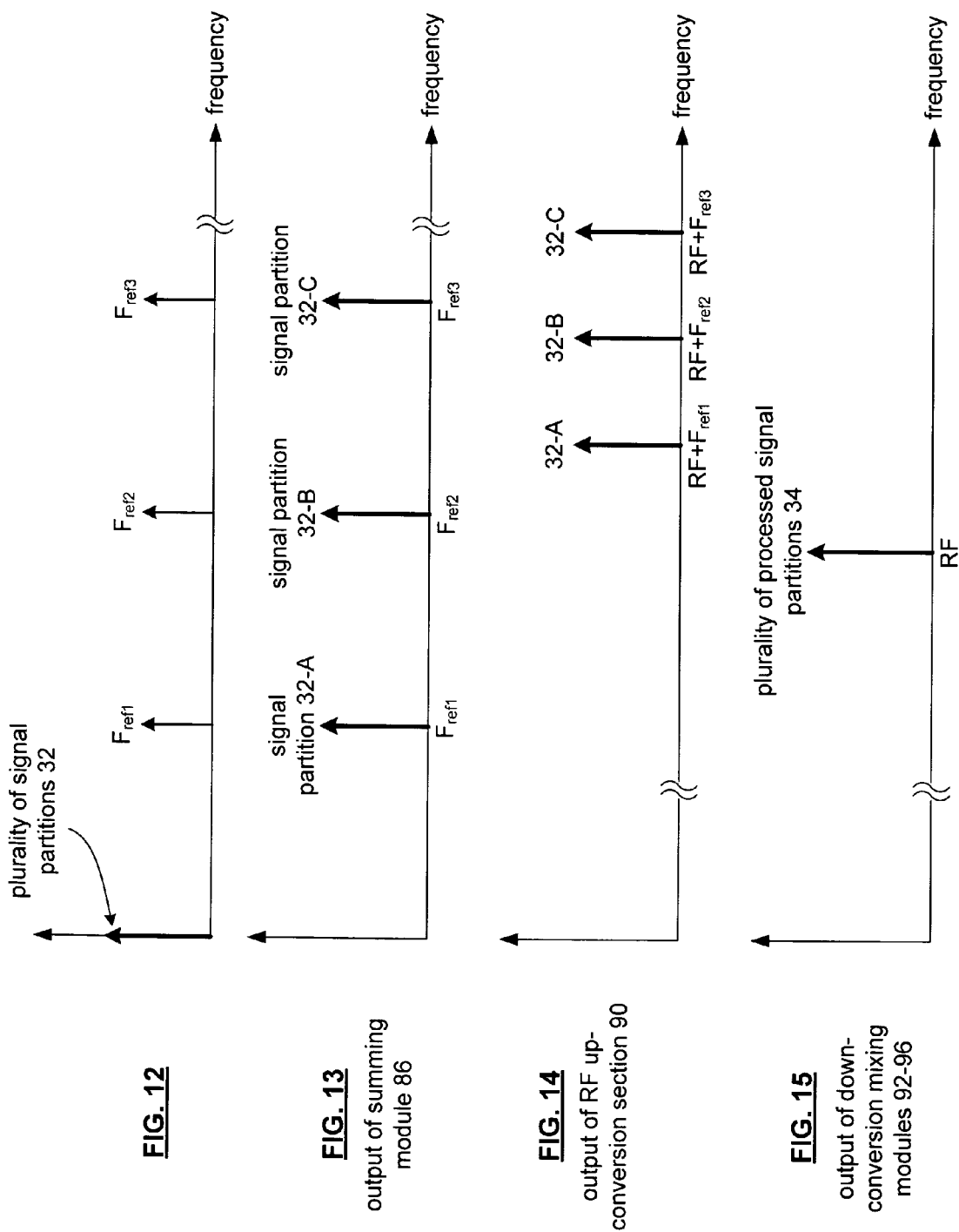

gating signal module 142 gating signal module 142 gating signal module 142

LOW POWER DISTRIBUTED TRANSMITTER

This patent application is claiming priority under 35 USC § 120 as a continuing patent application of co-pending patent application entitled LOW POWER DISTRIBUTED TRANSMITTER, having a filing date of Dec. 18, 2001, and a Ser. No. of 10/026,130, now issued as U.S. Pat. No. 7,184,490, on Feb. 27, 2007.

TECHNICAL FIELD OF THE INVENTION

This invention relates generally to radio technology and more particularly to radio transmitters.

BACKGROUND OF THE INVENTION

Radio transmitters are known to include a modulator, frequency up-converter, and a power amplifier to drive an antenna. While the basic structure of a radio transmitter is common over various applications, the particular construction of the elements of a radio transmitter is application dependent. For example, an IEEE 802.11a compliant radio transmitter includes a modulator that modulates incoming data utilizing binary phase shift keying (BPSK), quadrature phase shift keying (QPSK), 16 QAM (quadrature amplitude modulation) or 64 QAM in an orthogonal frequency division multiplex (OFDM) manner to produce modulated data. The frequency up-converter converts the base-band modulated data directly, or through an intermediate frequency stage, to a radio frequency signal having a frequency band in the 5-gigahertz range.

The power amplifier is designed to accurately amplify RF signals and to drive an antenna. An RF signal typically includes peaks that occur infrequently and has an average value that is significantly less than the peak. Note that for sinusoidal based signals, the average value is generally measured as an rms value. For example, an IEEE 802.11a compliant RF signal has a peak occurring every 50,000-100,000 symbols, but the average value is much less, yielding a significant peak-to-average ratio (e.g., 10-20 dB). Despite the infrequency of the peaks that are significantly greater than average values, a power amplifier must be designed to accurately accommodate the peak conditions as if they were frequent events. For instance, to support an average power transmission of 200 milliwatts (mW), with a peak-to-average ratio of 15 dB, the power amplifier should be a 6.3 Watt amplifier. As such, the power amplifier is generally running much below its capabilities, but is designed to handle the peak conditions. Aggressive system design can run the power amplifier at lower power so that peaks are distorted. This will increase the system error rate or require that the remainder of the system be higher performance, so that the total system performance is acceptable.

By having to design power amplifiers to handle signals with a large peak-to-average ratio, the average operating point must be a sufficient distance from the 1 dB compression point, which is approximately the point where the power amplifier loses linearity. Such power amplifiers consume more power than power amplifiers that have average operating points closer to the 1 dB compression point, are typically more expensive to construct, especially on integrated circuits, and/or have less range of operation.

Therefore, a need exists for improved power amplification of RF signals to reduce cost, to reduce power consumption, and/or to increase range of operation such that a lower power consuming transmitter may be obtained for various wireless communication standards including IEEE 802.11a.

BRIEF DESCRIPTION OF THE DRAWINGS

FIGS. 2-5 illustrate a graphical representation of the distributed processing of a low power amplifier in accordance with the present invention;

FIGS. 12-15 illustrate a frequency domain representation of the processing performed by the signal partitioning module and signal processing module of FIG. 11;

DETAILED DESCRIPTION OF A PREFERRED EMBODIMENT

Generally, the present invention provides a low power distributed transmitter that includes a signal generator, signal partitioning module, signal processing module, a plurality of amplifiers, and a transmitting module. The signal generator is operably coupled to generate a signal (e.g., symbols) to represent base-band data in accordance with a particular transmission protocol (e.g., Binary Phase Shift Keying (BPSK), Quadrature Phase Shift Keying (QPSK), 16 Quadrature Amplitude Modulation (QAM), 64 QAM). The signal partitioning module is operably coupled to partition the signal into a plurality of signal partitions based on a peak-to-average ratio of the signal. The signal partitioning module provides the plurality of signal partitions to the signal processing module, which processes each signal partition in accordance with the particular transmission protocol to produce processed signals. Such processing may include converting the signal partitions into analog signals and up-converting the frequency to the carrier frequency specified by the particular transmission protocol (e.g., 5.25 gigahertz). Each of the amplifiers amplifies a corresponding one of the processed signal partitions to produce amplified signal partitioned. The transmitting module transmits, via an antenna or a plurality of antennas, the amplified signal partitions as a composite amplified signal. With such a method and apparatus, a low power distributed transmitter is achieved that is less expensive to manufacturer, consumes less power and increases range of operation in comparison with prior embodiments of transmitters.

Figure 1:
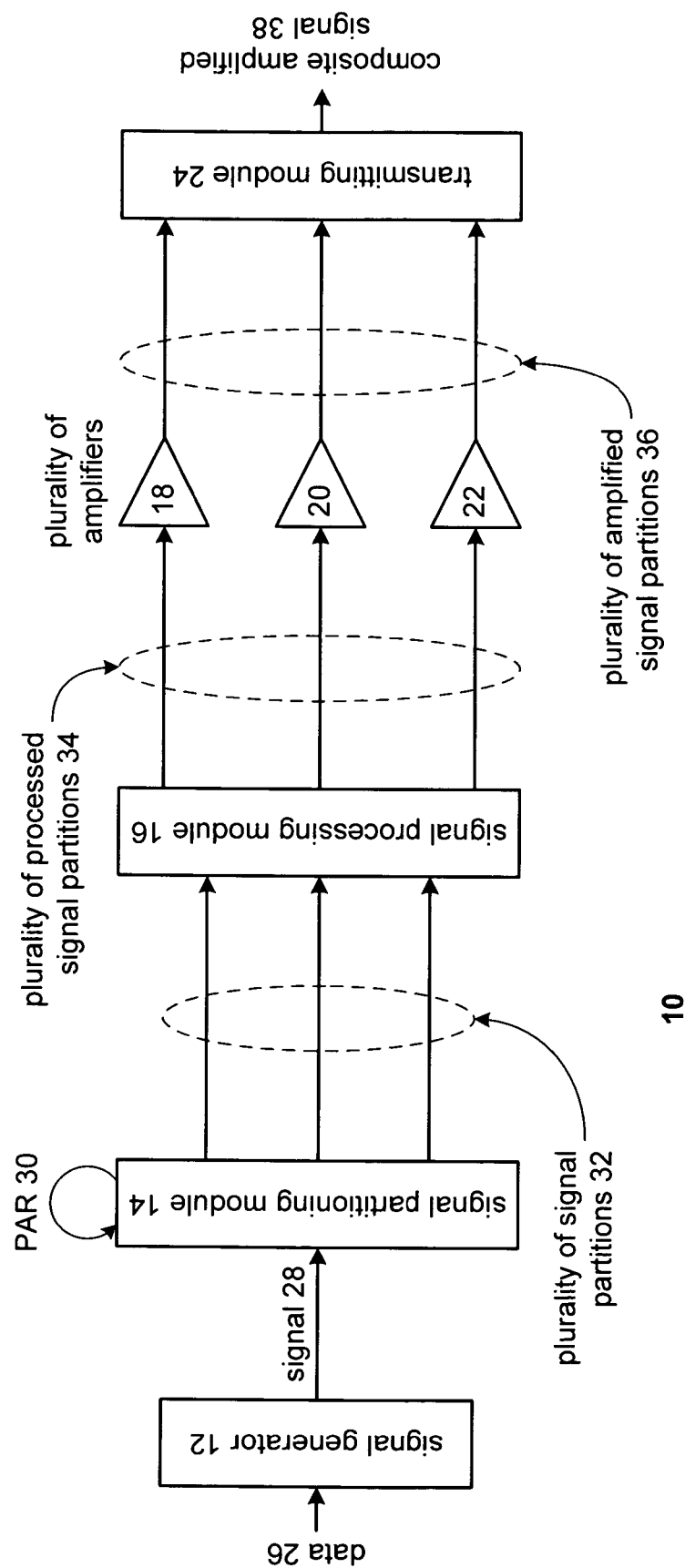
FIG. 1 illustrates a schematic block diagram of a low power distributed transmitter in accordance with the present invention.

The present invention can be more fully described with reference to FIGS. 1-22. FIG. 1 illustrates a schematic block diagram of a low power transmitter 10 that includes a signal generator 12, signal partitioning module 14, signal processing module 16, plurality of amplifiers 18-22, and a transmitting module 24. The signal generator 12, which may be implemented in a variety of ways—one of which will be discussed with reference to FIG. 9—is operably coupled to receive data 26 and produce therefrom signal 28 in accordance with an aspect of a transmission protocol. For instance, if the transmitter 10 is utilized in an IEEE 802.11a compliant transmitter, the incoming data 26 will be converted into symbols in accordance with one of a plurality of modulation schemes including BPSK, QPSK, 16 QAM and 64 QAM, discrete multi tone (DMT), and formatted in accordance with OFDM.

The signal partitioning module 14, which may be implemented in a variety of ways as further described with reference to FIGS. 10, 11, and 16, receives the signal 28 and, based on a peak-to-average ratio 30, generates a plurality of signal partitions 32. The signal processing module 16, which will be described in greater detail with reference to FIGS. 10, 11 and 16, receive the plurality of signal partitions 32 and processes them in accordance with the particular transmission protocol to produce a plurality of process signal partitions 34. Accordingly, depending on the transmission protocol, the signal processing module 16 up-converts the frequency of the signal partitions to the carrier frequency of the protocol. For example, if the protocol is IEEE802.11a, the up-converted frequency will be in the 5-gigahertz range.

The plurality of amplifiers is operably coupled to receive the plurality of process signals partitions 34 and produce a plurality of amplified signal partitions 36. Each of the plurality of amplifiers may be constructed as a Class A power amplifier having a selected output impedance. The output impedance is selected to match the load represented by antenna(s) of the transmitting module 24.

The transmitting module 24, which may be implemented in a variety of ways as further described with reference to FIGS. 7 and 8, receives the plurality of amplified signal partitions 36 and transmits them as a composite amplified signal 38. Accordingly, the transmitter module 24 is operably coupled to one or more antennas to transmit the amplified signal partitions as a composite amplified signal 38.

FIGS. 2-5 illustrate a graphical representation of the signal partitioning performed by the signal partitioning module 14. As shown in FIG. 2, the signal 28 is an analog signal that varies in magnitude and includes occasional peaks. The partitioning module, for this example, divides the signal 28 into three partitions (partition A, partition B and partition C). Accordingly, the portion of the signal 28 that falls in the range of partition A is one of the plurality of signal partitions, the portion of signal 28 that falls within partition B is another signal partition, and the portions of the signal 28 that fall within partition C form another signal partition.

FIG. 3 illustrates a graphical representation of the signal partition 32A, which corresponds to the portion of signal 28 that falls within partition A. As shown, when the magnitude of signal 28 exceeds the thresholds of partition A, the signal is sliced at the threshold of partition A.

FIG. 4 illustrates a graphical representation of the portions of signal 28 that lie in partition B. The resulting signal partition 32B includes the portions of signal 28A that lie within partition B. In this illustration, the signal portions that lie within partition A are set to 0, (i.e., partition A is collapsed) such that the resulting signal is the components within partition B. In other words, the portions of signal 28 that lie within partition A are set to 0 while portions of signal 28 that lie within partition C are sliced to the upper thresholds of partition B.

FIG. 5 illustrates a graphical representation of signal partition 32C, which represents the portion of signal 28 that lies within partition C. In this illustration, the portions of signal 28 that lie in partitions A and B are set to zero such that only the portions that lie within partition C are shown.

Figure 6:
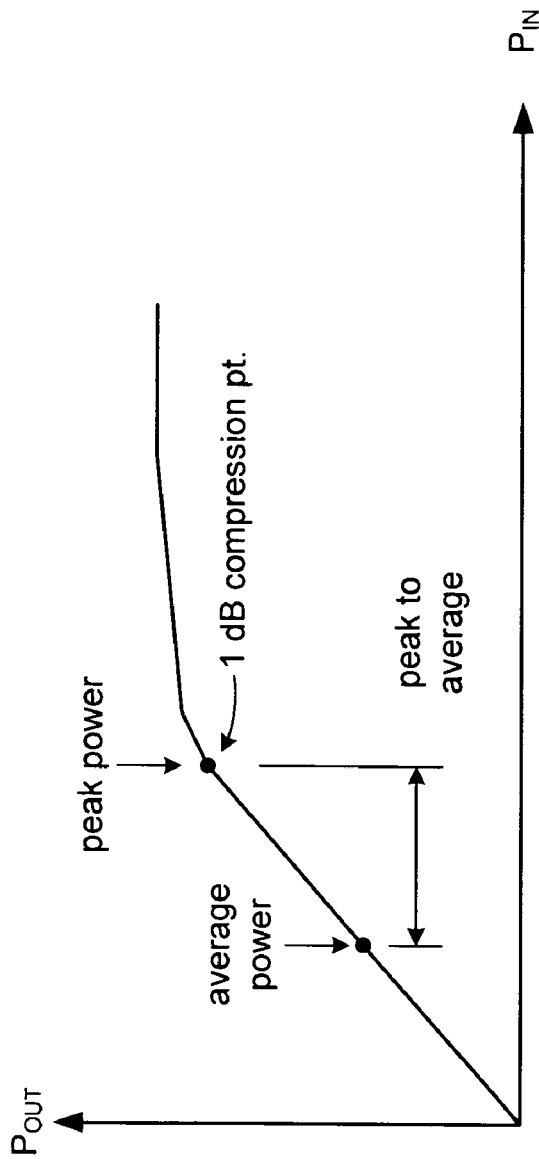
FIG. 6 illustrates a graph of output power versus input power of a power amplifier in accordance with the present invention.

FIG. 6 illustrates a graph of input power versus output power for power amplifiers. As shown, the input power versus output power is linear up until a particular output power and then gradually becomes non-linear. The point where the output signal is approximately 95% of the input signal is defined as the 1 dB compression point. Accordingly, each power amplifier that is designed for high performance and to handle a peak power, the peak power is used to establish the 1 dB compression point for the amplifier. With the partitioning of the signals such that a plurality of amplifiers are amplifying portions of the signal, the peak-to-average ratio for the power amplifiers 18-22 of FIG. 1 will cumulatively have a lower-to-peak average ratio than a single amplifier for signal 28 thus, the average power point may move closer to the 1 dB compression point. Accordingly, by raising the average power point closer to the 1 dB compression point, the amplifiers 18-22 have less cumulative power consumption than a single amplifier for the same signal, are cumulatively more efficient, are cumulatively physically smaller to implement on integrated circuits, and are thus cumulatively less expensive.

Figure 7:
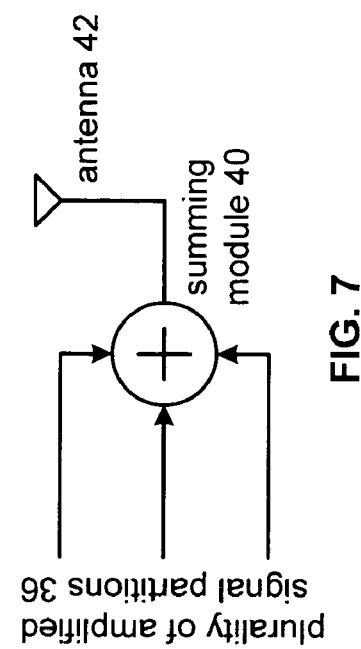
FIG. 7 illustrates a schematic block diagram of a transmitting module in accordance with the present invention.

FIG. 7 illustrates a schematic block diagram of an embodiment of the transmitting module 24. In this illustration, the transmitting module 24 includes a summing module 40 and antenna 42. The summing module, which may be a ferromagnetic coupler, sums the plurality of amplified signal partitions 36 together to produce a composite signal. The composite signal is transmitted via antenna 42.

Figure 8:
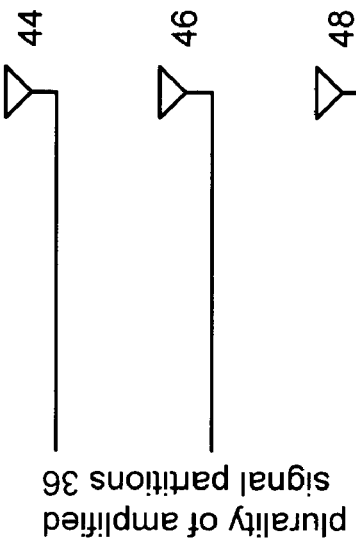
FIG. 8 illustrates an alternate schematic block diagram of a transmitting module in accordance with the present invention.

FIG. 8 illustrates an alternate schematic block diagram of transmitting module 24. In this embodiment, the transmitting module 24 includes a plurality of antennas 44-48. Each antenna is spaced one wavelength apart such that when the plurality of amplified signal partitions 36 is transmitted via the plurality of antennas 44-48, a composite RF signal is transmitted.

Figure 9:
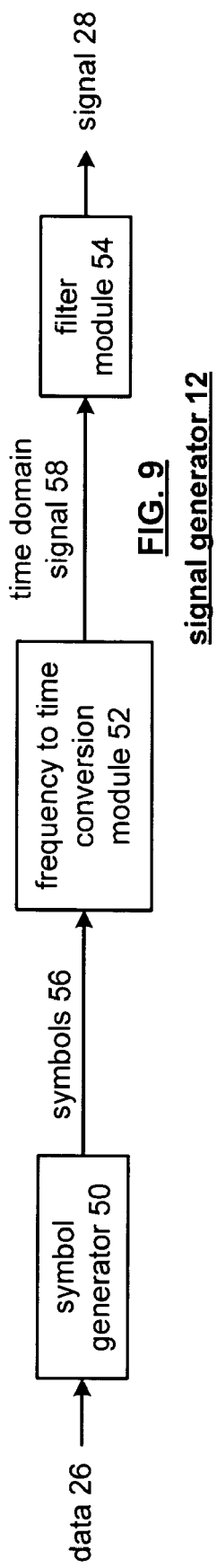
FIG. 9 illustrates a schematic block diagram of a signal generator in accordance with the present invention.

FIG. 9 illustrates a schematic block diagram of an embodiment of the signal generator 12. In this embodiment, the signal generator 12 includes a symbol generator 50, a frequency-to-time conversion module 52, and a filter module 54. The symbol generator 50 is operably coupled to receive data 26 and produce symbols 56 therefrom. The symbol generator 50 generates these symbols in accordance with one or more transmission protocols that include OFDM, DTM, BPSK, QPSK, 16 QAM and 64 QAM.

The frequency-to-time conversion module 52, which may be performing an inverse fast Fourier transform (IFFT), receives the symbols 56 and produces a time domain digital signal 58 therefrom. The filtering module 54 filters the time domain signal 58 to produce the signal 28.

Figure 10:
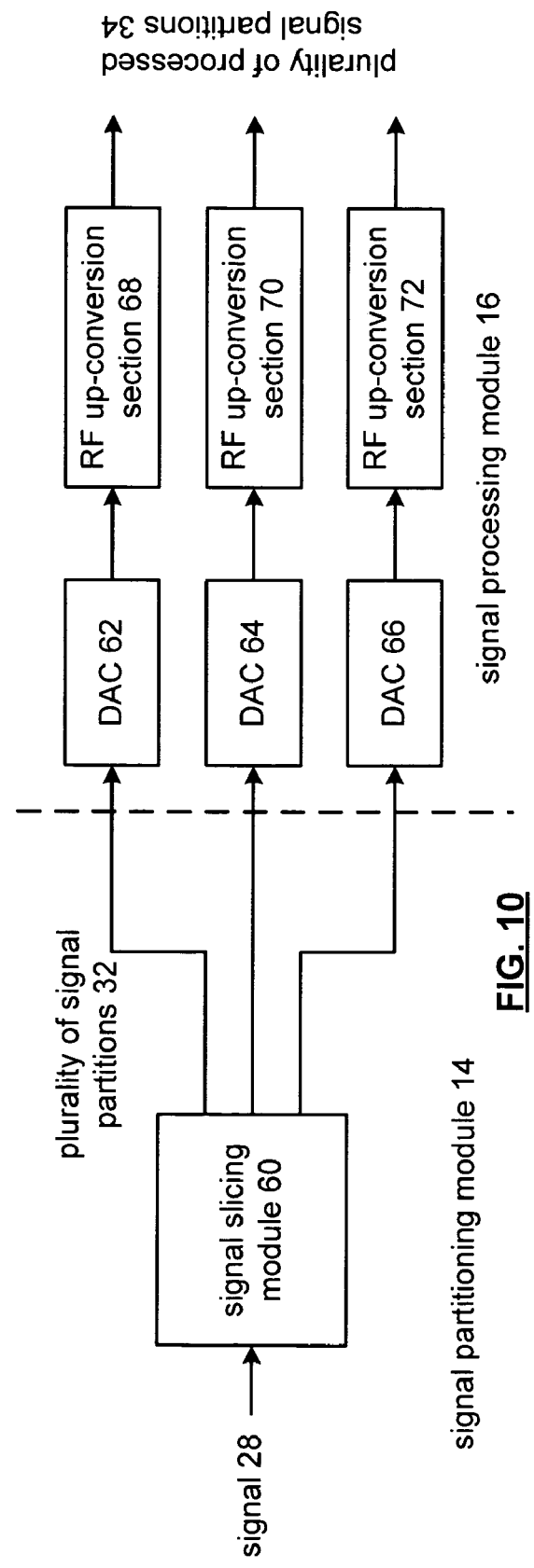
FIG. 10 illustrates a schematic block diagram of a signal partitioning module and signal processing module in accordance with the present invention.

FIG. 10 illustrates a schematic block diagram of the signal partitioning module 14 and a corresponding signal processing module 16. In this embodiment, the signal partitioning module 14 includes a signal slicing module 60, while the signal processing module 16 includes a plurality of digital-to-analog converters 62-66 and a plurality of radio frequency (RF) up-conversion sections 68-72. The signal slicing module 60 receives the signal 28 and produces the plurality of signal partitions 32. In essence, the signal slicing module 60 slices the incoming signal 28 to produce the plurality of signal partitions as illustrated in FIGS. 3-5. Note that the signal slicing module 60 may also produce an in-phase component and quadrature component for each of the signal partitions. As such, each signal partition includes in-phase and quadrature components.

The signal processing module 16, via the digital-to-analog converters 62-66 receive the plurality of signal partitions 32. Note that if each of the signal partitions includes an in-phase component and a quadrature component, the signal processing module 16, per signal partition, would include two digital-to-analog converters and two RF up-conversion sections; one for the in-phase component and another for the quadrature component.

Each of the digital-to-analog converters 62-66 converts the signal partitions 32 into analog signals. The analog signals are received by the RF up-conversion section 68-72, which mixes the analog signals with a local oscillation to produce the plurality of processed signal partitions 34. Accordingly, the processed signal partitions 34 are RF signals that represent the signal partitions.

Figure 11:
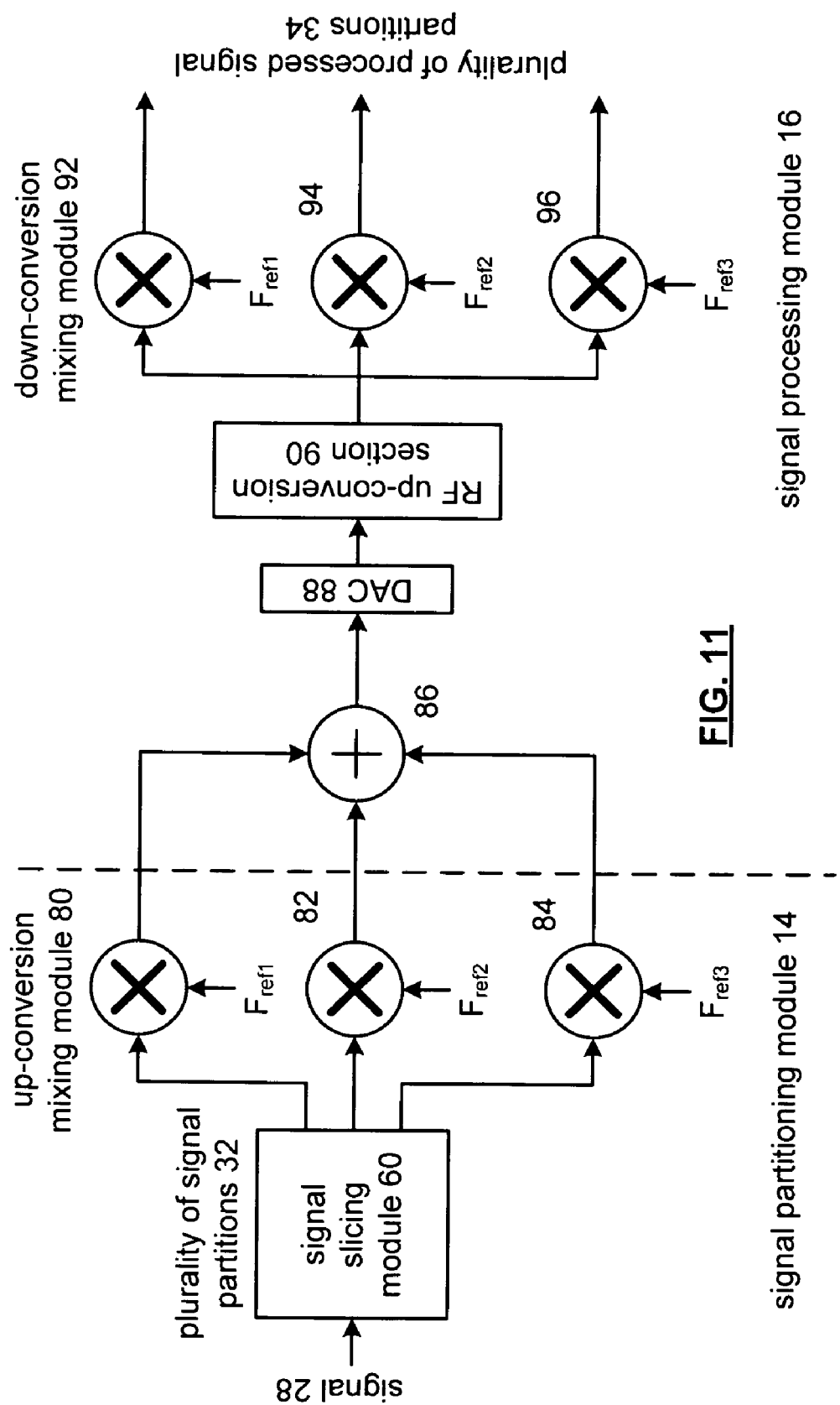
FIG. 11 illustrates an alternate schematic block diagram of a signal partitioning module and signal processing module in accordance with the present invention.

FIG. 11 illustrates an alternate embodiment of the signal partitioning module 14 and the signal processing module 16. The signal partitioning module 14 includes the signal slicing module 60 and up-conversion modules 80-84. The signal processing module 16 includes a summing module 86, digital-to-analog converter 88, RF up-conversion section 90, and a plurality of down-conversion mixing modules 92-96.

The signal slicing module 60 receives the signal 28 and produces therefrom the plurality of signal partitions 32. The $1^{st}$ up-conversion mixing module 80 mixes one of the signal partitions with a $1^{st}$ reference frequency to produce a $1^{st}$ mixed signal partition. A $2^{nd}$ up-conversion mixing module 82 mixes a $2^{nd}$ signal partition with a $2^{nd}$ reference frequency to produce a $2^{nd}$ mixed signal partition. The $3^{rd}$ up-conversion module 84 mixes a $3^{rd}$ signal partition with a $3^{rd}$ reference frequency to produce a $3^{rd}$ mixed signal partition. As one of average skill in the art will appreciate, the number of signal partitions generated by the signal slicing module 60 and hence the number of corresponding up-conversion mixing modules 80 may deviate from the 3 illustrated in FIG. 11.

The frequencies used for the $1^{st}$, $2^{nd}$ and $3^{rd}$ reference frequencies may be 20 megahertz, 40 megahertz and 60 megahertz, respectively. Alternatively, the $1^{st}$ signal partition may be passed directly to summing module 86 while the $2^{nd}$ and $3^{rd}$ signal partitions are mixed with a 20 megahertz reference frequency and a 40 megahertz reference frequency, respectively. As one of average skill in the art will appreciate, the particular reference frequencies used may vary from the example provided as long as the selected reference frequency does not significantly interfere with the up-conversion performed by the RF up-conversion section 90.

Summing module 86 sums the mixed signal partitions to produce a resulting signal. The digital-to-analog converter 88 converts the summed mixed signals into an analog signal. The RF up-conversion section 90 up-converts the summed mixed signals to a carrier frequency or frequencies. At this point, the up-converted signal is processed by a plurality of down-conversion mixing modules 92-96. In essence, the down-conversion mixing modules 92-96 remove the reference frequencies that were inserted by the up-conversion mixing modules 80-84. The resulting signals are the plurality of processed signal partitions 34.

FIGS. 12-15 illustrate the processing performed by the signal partitioning module 14 and signal processing module 16 of FIG. 11. FIG. 12 illustrates the frequency response of the plurality of signal partitions 32, the $1^{st}$, $2^{nd}$ and $3^{rd}$ reference frequencies at the inputs of the corresponding up-conversion mixing modules 80-84. FIG. 13 illustrates the output of summing module 86, which includes the signal partition 32A being up-converted to reference frequency 1, signal partition 32B being up-converted to reference frequency 2, and signal partition 32C being up-converted to reference frequency 3.

FIG. 14 illustrates the frequency response at the output of the RF up-conversion section 90. The output illustrates signal partition 32A at a frequency of the RF frequency plus the $1^{st}$ reference frequency, signal partition 32B at the reference frequency plus the $2^{nd}$ reference frequency, and signal partition 32C at the RF frequency plus the reference frequency 3.

FIG. 15 illustrates the output of the down-conversion mixing modules 92-96. Each of the down-conversion mixing modules removes the corresponding reference frequency such that the plurality of processed signal partitions 34 all have the same frequency, which is the RF frequency. As one of average skill in the art will appreciate, the architecture illustrated in FIG. 15 has a relatively small part count, thus saves costs.

Figure 16:
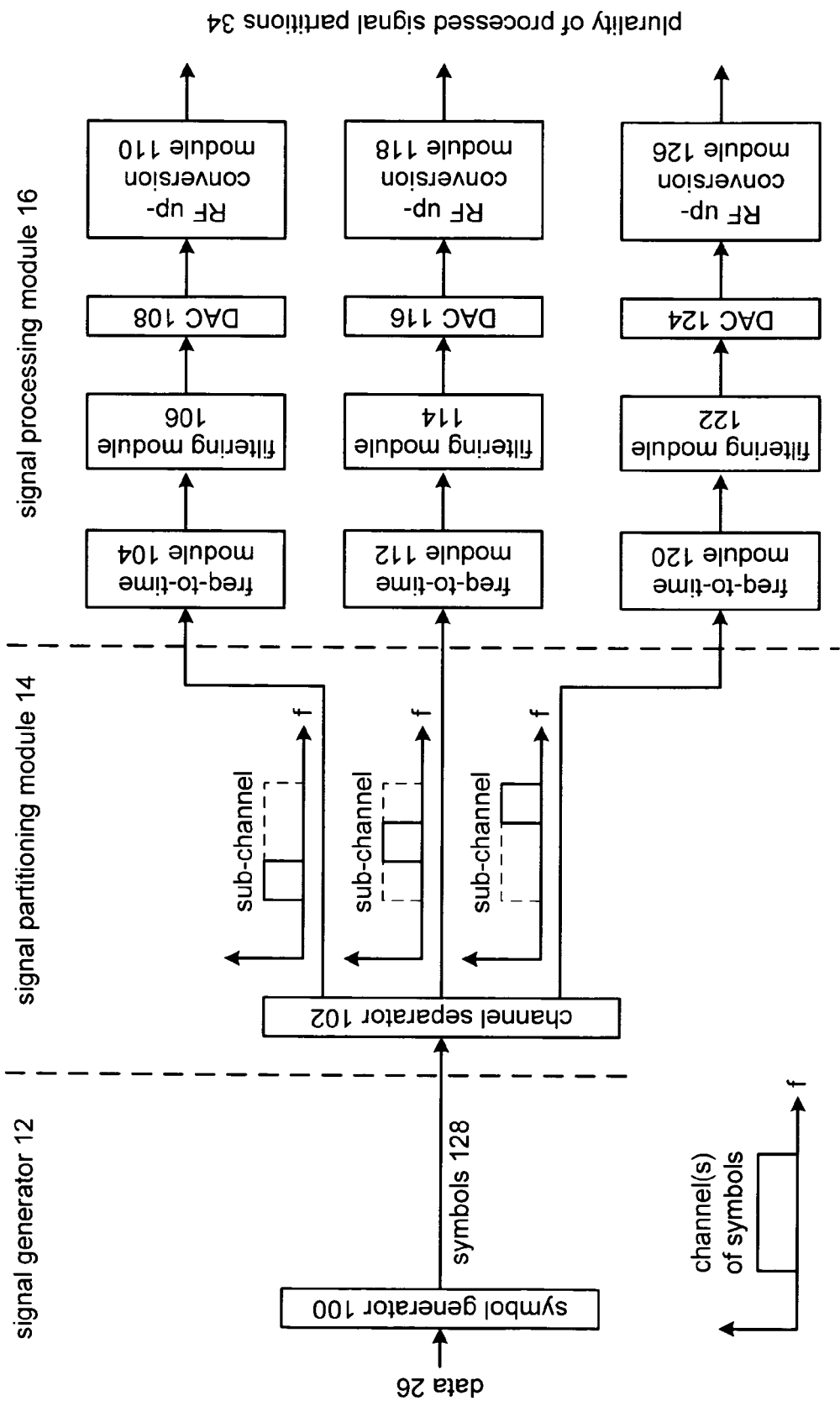
FIG. 16 illustrates an alternate schematic block diagram of a low power transmitter in accordance with the present invention.

FIG. 16 illustrates an alternate schematic block diagram for the signal generator 12, signal partitioning module 14 and signal processing module 16. In this embodiment, the signal generator 60 includes a symbol generator 100 that produces symbols 128 from data 26. The symbols 128 are mapped into subchannels of the allocated frequency band as graphically illustrated, which may be done in accordance with a wireless communication standard, such as IEEE 802.11a.

The signal partitioning module 14 includes a sub-channel separator 102 that divides a channel of symbols into sub-channels. Each of the sub-channels is transmitted separately as partitions of the signal. Such sub-channel separation may be done in the digital domain on a symbol by symbol basis.

The signal processing module 16 includes a plurality of frequency-to-time conversion modules 104, 112 and 120, a plurality of filtering modules 106, 114 and 122, a plurality of digital-to-analog converters 108, 116 and 124, and a plurality of RF up-conversion modules 110, 118 and 126. Each of the frequency-to-time conversion modules 104, 112 and 120 receives a respective sub-channel from the channel separator 102 and performs an IFFT thereon to produce a time domain signal. The corresponding filter module 106, 114 or 122 then filters the time domain signal. The filtered signal is then converted to an analog signal by digital-to-analog converters 108, 116 and 124, respectively. The analog signals are then up-converted to a carrier frequency by the RF up-conversion module 110, 118 and 126 to produce the plurality of processed signal partitions 34.

Figure 17:
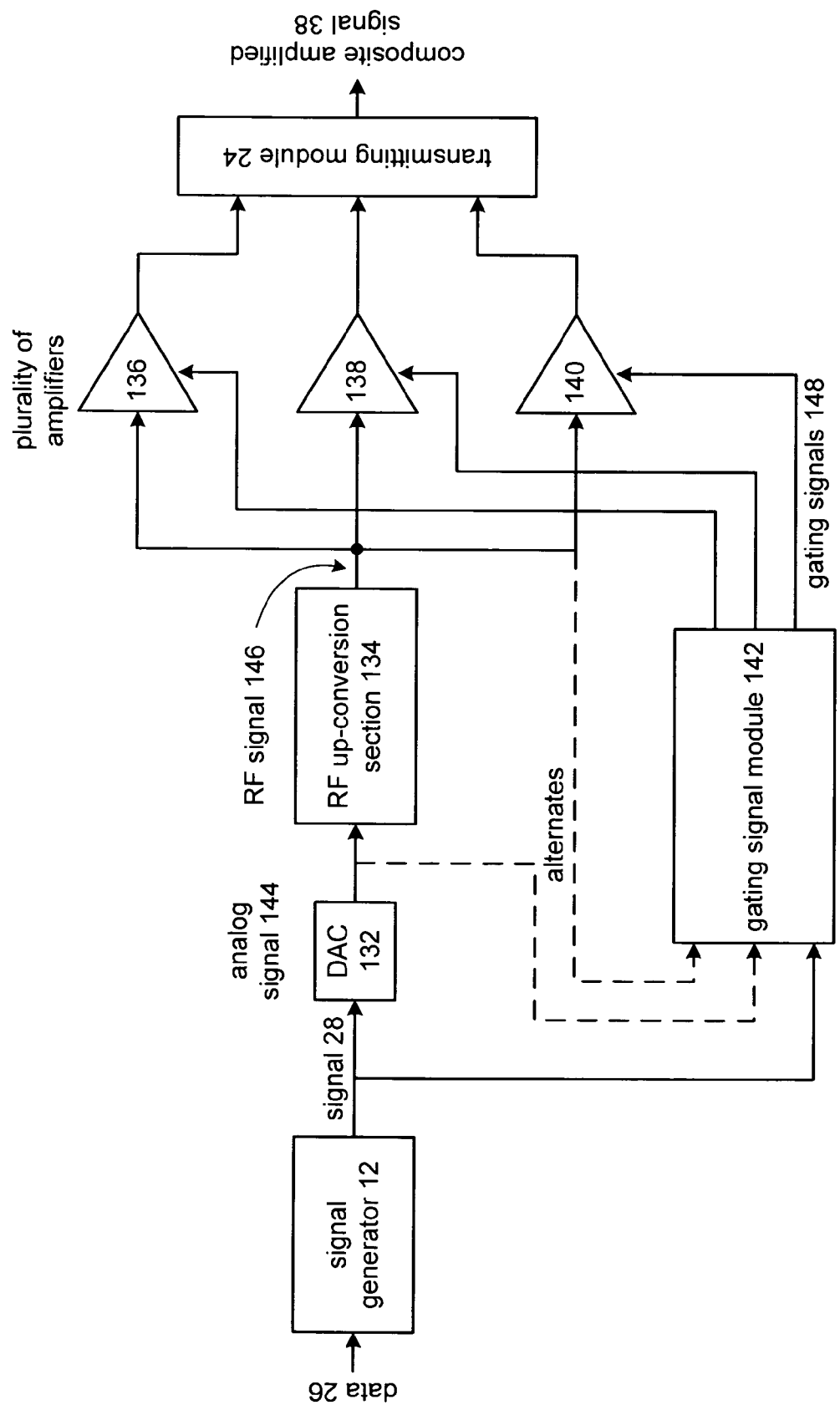
FIG. 17 illustrates a schematic block diagram of an alternate embodiment of a low power transmitter in accordance with the present invention.

FIG. 17 illustrates a low power transmitter 130 that includes the signal generator 12, a digital-to-analog converter 132, an RF up-conversion section 134, a plurality of amplifiers 136-140, the transmitting module 24 and a gate signaling module 142. In this embodiment, the signal generator 12 receives data 26 and produces signal 28 therefrom. A digital-to-analog converter 132 converts the signal 28 into analog signals 144, which are converted to RF signals 146 by the RF up-conversion section 134. Accordingly, the RF signal 146 does not include partitions as in the previous embodiments of the low power transmitter. In this embodiment however, the plurality of amplifiers 136, 138 and 140 are enabled based on the peak-to-average ratio of the signal 28, the analog signal 144 or the RF signal 146. As such, the gating signal module 142, via gating signals 148, enables one or more of the plurality of amplifiers 136-140 to amplify the RF signal 146. For example, if the signal 28 only includes magnitude of the signal within partition A, as shown in FIG. 2, only power amplifier 136 will be enabled. When signal 28 has magnitudes in the partition B range, as shown in FIG. 2, power amplifiers 136 and 138 are enabled. When the signal 28 has magnitudes in the partition C range, all three power amplifiers are enabled. Accordingly, a plurality of amplified signal partitions are achieved, which are provided to the transmitting module 24. The transmitting module 24 transmits the plurality of amplified signal partitions to produce the composite amplified signal 38.

Figure 18:
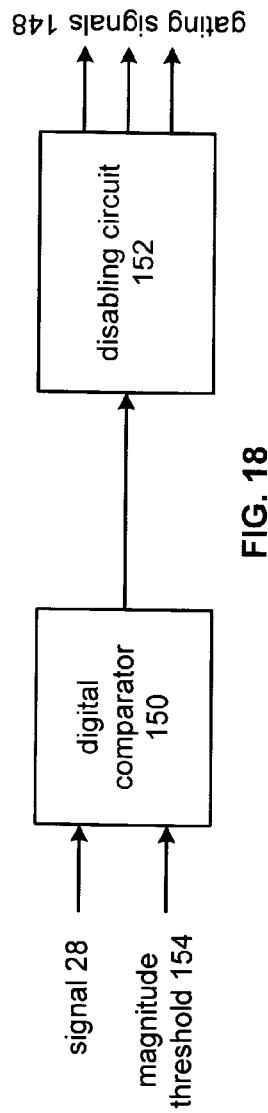
FIGS. 18-20 illustrate various embodiments of a gating signal module for use in the low power transmitter of FIG. 17.
Figure 19:
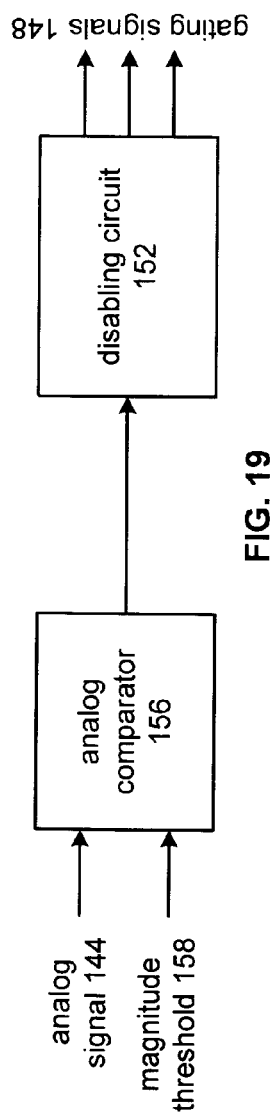
Figure 20:
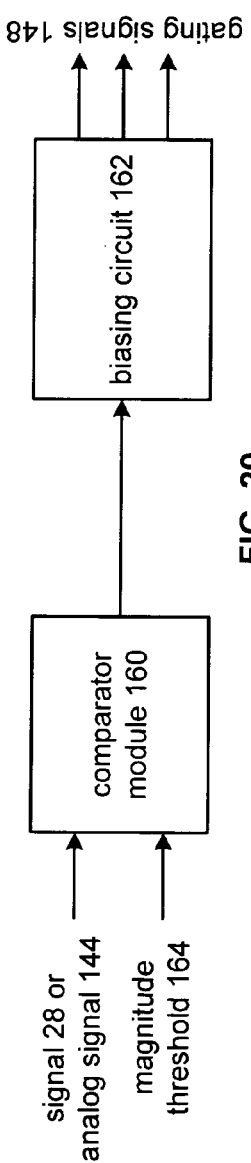

FIGS. 18-20 illustrate various embodiments of the gating signal module 142. In FIG. 18, the gating signal module 142 includes a digital comparator 150 and a disabling circuit 152. Accordingly, the digital comparator 150 compares the magnitude of signal 28 with magnitude thresholds 154. As previously discussed, when the magnitude of signal 28 exceeds certain magnitude thresholds, one or more of the amplifiers are enabled, and were disabled in accordance with the gating signals 148 produced by disabling circuit 152.

FIG. 19 illustrates the gating signal module 142 including an analog comparator 156 and the disabling circuit 152. In this embodiment, the analog signal 144 is compared with the magnitude thresholds 158. Based on this comparison, disabling circuit 152 generates the gating signals 148 to turn-off one or more of the plurality of amplifiers.

FIG. 20 illustrates the gating signal module 142 including a comparator module 160, which may be analog or digital, and a biasing circuit 162. Based on the comparison of the signal 28 or the analog signal 144 with magnitude thresholds 164, the biasing circuit biases, via the gating signals 148, the plurality of amplifiers. Such biasing enables one or more of the power amplifiers to amplify the RF signal.

Figure 21:
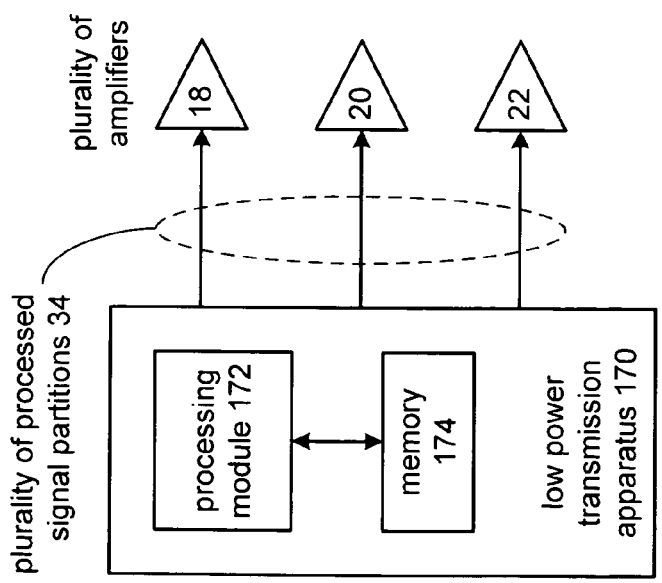
FIG. 21 illustrates a schematic block diagram of another embodiment of a low power transmitter in accordance with the present invention.

FIG. 21 illustrates a schematic block diagram of a low power transmission apparatus 170 that includes a processing module 172 and memory 174. The low power transmission apparatus 170 is operably coupled to produce a plurality of processed signal partitions 34 that are supplied to a plurality of amplifiers 18-22. The processing module 172 may be a single processing device or a plurality of processing devices. Such a processing device may be a microprocessor, microcontroller, digital signal processor, microcomputer, central processing unit, field programmable gate array, programmable logic device, state machine, logic circuitry, and/or any device that manipulates signals (analog and/or digital) based on operational instructions. The memory 174 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 172 implements one or more of its functions via a state machine or logic circuitry, the memory storing the corresponding operational instructions is embedded with the circuitry comprising the state machine or logic circuitry. The memory 174 stores, and the processing module 172 executes, operational instructions corresponding to at least some of the steps illustrated in FIG. 22.

Figure 22:
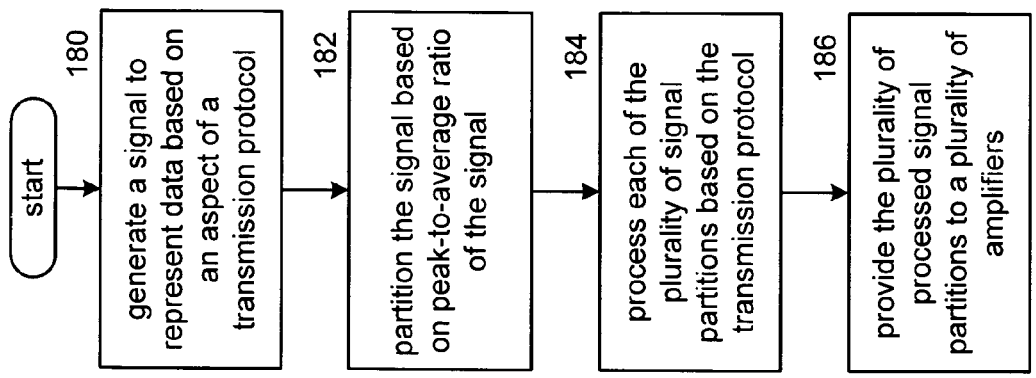
FIG. 22 illustrates a logic diagram of a method for distributing processing within a low power transmitter.

FIG. 22 illustrates a logic diagram of a method for processing low power transmissions in a transmitter. The process begins at Step 180 where a signal is generated to represent data based on an aspect of a transmission protocol. Such transmission protocols include OFDM, BPSK, QPSK, 16 QAM, 64 QAM, and DMT. Accordingly, the data is converted into symbols, which are then converted from the-frequency domain to the time domain to produce the resulting signals. The resulting signals may then be filtered before further processing.

The process then proceeds to Step 182 where the signal is partitioned based on peak-to-average ratio of the signal. This may be done in a variety of ways that will be subsequently discussed. The process then proceeds to Step 184 where each of the plurality of signal partitions are processed based on the transmission protocol to produce a plurality of processed signal partitions. This also may be done in a variety of ways, which will be subsequently discussed. The process then proceeds to Step 186 where the plurality of processed signal partitions are provided to a plurality of amplifiers such that each of the plurality of amplifiers amplifies the corresponding one of the plurality of processed signal partitions. The amplified signal partitions are then transmitted via a transmitting section that includes one or more antennas.

The partitioning of the signal may be done by slicing the signal at a $1^{st}$ level to produce a $1^{st}$ signal partition and slicing the signal between the $1^{st}$ level and a $2^{nd}$ level to produce a $2^{nd}$ signal partition. The processing of the $1^{st}$ and $2^{nd}$ signal partitions may be done by converting the $1^{st}$ signal partition into a $1^{st}$ analog signal and converting the $2^{nd}$ signal partition into a $2^{nd}$ analog signal. The $1^{st}$ and $2^{nd}$ analog signals are then up-converted into a $1^{st}$ RF signal and $2^{nd}$ RF signal, respectively. Note that the $1^{st}$ and $2^{nd}$ analog signals may include an I component and Q component, respectively.

Alternatively, the partitioning of the signal may be done by slicing the signal at a $1^{st}$ level to produce a $1^{st}$ signal partition and slicing the signal between a $1^{st}$ level and a $2^{nd}$ level to produce a $2^{nd}$ signal partition. The $1^{st}$ signal partition may then be mixed with a $1^{st}$ reference frequency to produce a $1^{st}$ mixed signal partition while the $2^{nd}$ signal partition is mixed with a $2^{nd}$ reference frequency to produce a $2^{nd}$ mixed signal partition. The processing of Step 184 may then include summing the $1^{st}$ and $2^{nd}$ mixed signal partitions to produce a summed partitioned signal. The summed partitioned signal is then converted into an analog signal, which is then up-converted into an RF signal. The RF signal is then mixed with the $1^{st}$ reference frequency to produce a $1^{st}$ processed signal partition and the RF signal is also mixed with the $2^{nd}$ reference frequency to produce a $2^{nd}$ processed signal partition.

The preceding discussion has presented a method and apparatus for a low power distributed transmitter. By distributing the amplification of RF signals among a plurality of amplifiers, the power consumption of traditional power amplifiers is reduced thereby reducing cost and improving operating range and efficiency. As one of average skill in the art will appreciate, other embodiments may be derived from the teaching of the present invention, without deviating from the scope of the claims.

The invention claimed is:

1. A low power transmitter comprises:
    a signal generator operably coupled to generate a signal to represent data based on a first aspect of a transmission protocol;
    a signal partitioning module operably coupled to partition the signal based on peak-to-average ratio of the signal to produce a plurality of signal partitions;
    a signal processing module operably coupled to process each of the plurality of signal partitions based on a second aspect of the transmission protocol to produce a plurality of processed signal partitions;
    a plurality of amplifiers, wherein each of the plurality of the amplifiers amplifies a corresponding one of the plurality of processed signal partitions to produce a plurality of amplified signal partitions; and a transmitting module operably coupled to transmit the plurality of amplified signal partitions as a composite amplified signal.

2. The low power transmitter of claim 1, wherein the signal generator comprises:
- a symbol generator operably coupled to produce symbols that represent the data in a frequency domain based on the first aspect of the transmission protocol;
- a frequency-to-time conversion module operably coupled to convert the symbols into a time domain signal; and
- a filtering module operably coupled to filter the time domain signal to produce the signal, wherein the transmission protocol includes at least one of: orthogonal frequency
- division multiplexing (OFDM), binary phase shift keying (BPSK), quadrature phase shift keying (QPSK), quadrature amplitude modulation (QAM), and discrete multi-tone (DMT).

3. The low power transmitter of claim 2, wherein the transmitting module comprises:
- a summing module operably coupled to sum the plurality of amplified signal partitions to produce a transmission signal; and
- an antenna operably coupled to transmit, as a radio frequency signal, the transmission signal.

4. The low power transmitter of claim 2, wherein the transmitting module comprises:
- a plurality of antennas that correspondingly transmits the plurality of amplified signal partitions such that, when transmitted, the plurality of amplified signal partitions sum together in air to produce the composite amplified signal.

5. The low power transmitter of claim 1, wherein each of the plurality of amplifiers comprises:
- a Class A power amplifier having a selected output impedance.

6. A method for low power transmissions, the method comprises:
- generating a signal to represent data based on a first aspect of a transmission protocol;
- partitioning the signal based on peak-to-average ratio of the signal to produce a plurality of signal partitions;
- processing each of the plurality of signal partitions based on a second aspect of the transmission protocol to produce a plurality of processed signal partitions; and
- providing the plurality of processed signal partitions to a plurality of amplifiers such that each of the plurality of the amplifiers amplifies a corresponding one of the plurality of processed signal partitions.

7. The method of claim 6, wherein the generating the signal comprises:
- producing symbols that represent the data in a frequency domain based on the first aspect of the transmission protocol;
- frequency-to-time converting the symbols into a time domain signal; and
- filtering the time domain signal to produce the signal, wherein the transmission protocol includes at least one of: orthogonal frequency division multiplexing (OFDM), binary phase shift keying (BPSK), quadrature phase shift keying (QPSK), quadrature amplitude modulation (QAM), and discrete multi-tone (DMT).

8. An apparatus for low power transmissions, the apparatus comprises:
- a processing module; and
- a memory operably coupled to the processing module, wherein the memory includes operational instructions that cause the processing module to:
  - generate a signal to represent data based on a first aspect of a transmission protocol;
  - partition the signal based on peak-to-average ratio of the signal to produce a plurality of signal partitions;
  - process each of the plurality of signal partitions based on a second aspect of the transmission protocol to produce a plurality of processed signal partitions; and
  - provide the plurality of processed signal partitions to a plurality of amplifiers such that each of the plurality of the amplifiers amplifies a corresponding one of the plurality of processed signal partitions.

9. The apparatus of claim 8, wherein the memory further comprises operational instructions that cause the processing module to generate the signal by:
- producing symbols that represent the data in a frequency domain based on the first aspect of the transmission protocol;
- frequency-to-time converting the symbols into a time domain signal; and
- filtering the time domain signal to produce the signal, wherein the transmission protocol includes at least one of: orthogonal frequency division multiplexing (OFDM), binary phase shift keying (BPSK), quadrature phase shift keying (QPSK), quadrature amplitude modulation (QAM), and discrete multi-tone (DMT).

* * * * *